(12) United States Patent
Makihara et al.

(10) Patent No.: US 8,722,768 B2
(45) Date of Patent: May 13, 2014

(54) LIQUID RESIN COMPOSITION AND SEMICONDUCTOR DEVICE

(75) Inventors: Kouji Makihara, Kitakyushu (JP); Ryuichi Murayama, Narashimo (JP)

(73) Assignee: Sumitomo Bakelite Co., Ltd., Tokyo (JP)

( * ) Notice: Subject to any disclaimer, the term of this patent is extended or adjusted under 35 U.S.C. 154(b) by 0 days.

(21) Appl. No.: 13/817,351

(22) PCT Filed: Sep. 26, 2011

(86) PCT No.: PCT/JP2011/071836
§ 371 (c)(1),
(2), (4) Date: Feb. 15, 2013

(87) PCT Pub. No.: WO2012/043450
PCT Pub. Date: Apr. 5, 2012

(65) Prior Publication Data
US 2013/0143983 A1   Jun. 6, 2013

(30) Foreign Application Priority Data

Sep. 30, 2010   (JP) ................................. 2010-220164

(51) Int. Cl.
| | |
|---|---|
| *C09J 163/00* | (2006.01) |
| *C08F 20/10* | (2006.01) |
| *H01L 21/52* | (2006.01) |
| *C08J 5/12* | (2006.01) |
| *C09J 133/08* | (2006.01) |
| *C23C 18/00* | (2006.01) |
| *C09J 151/00* | (2006.01) |
| *C23C 18/12* | (2006.01) |
| *C23C 18/16* | (2006.01) |
| *C09J 133/10* | (2006.01) |

(52) U.S. Cl.
CPC ............ *C09J 163/00* (2013.01); *C09J 151/003* (2013.01); *C23C 18/1233* (2013.01); *C23C 18/1639* (2013.01); *C09J 133/08* (2013.01); *C09J 133/10* (2013.01); *C08F 20/10* (2013.01)
USPC .............................. 523/438; 438/13; 526/319

(58) Field of Classification Search
CPC   H01L 21/52; C23C 18/1233; C23C 18/1639; C08J 5/12; C08J 2435/02; C08J 2433/26; C09J 4/00; C09J 133/08; C09J 133/10; C09J 163/00; C09J 151/003; C08F 20/10
USPC ............................... 523/438; 438/13; 526/319
See application file for complete search history.

(56) References Cited

FOREIGN PATENT DOCUMENTS

| | | | |
|---|---|---|---|
| JP | 2005-154687 | A | 6/2005 |
| JP | 2007-2044 | A | 1/2007 |
| JP | 2008-235501 | A | 10/2008 |
| JP | 2009-108186 | A | 5/2009 |
| JP | 2009108186 | A * | 5/2009 |
| JP | 2010-84008 | A | 4/2010 |
| JP | 2010084008 | A * | 4/2010 |

OTHER PUBLICATIONS

International Search Report for PCT/JP2011/071836 dated Dec. 20, 2011.

* cited by examiner

*Primary Examiner* — Michael M Bernshteyn
(74) *Attorney, Agent, or Firm* — Birch, Stewart, Kolasch & Birch, LLP

(57) ABSTRACT

According to the invention, a liquid resin composition which has favorable wet spreadability after mounting of a chip and exhibits excellent solder cracking resistance even in a high-temperature solder reflow process at about 260° C., i.e., even when being used in lead-free solder, and a semiconductor package using the liquid resin composition are provided. In the liquid resin composition of the invention, an acrylic copolymer having a radical polymerizable functional group contains alkyl(meth)acrylate as a constituent monomer having a linear or branched alkyl group having 6 to 9 carbon atoms in an amount of 10 wt % to 40 wt % of the entire constituent monomers.

5 Claims, No Drawings

LIQUID RESIN COMPOSITION AND SEMICONDUCTOR DEVICE

TECHNICAL FIELD

The present invention relates to a liquid resin composition and a semiconductor device.

Priority is claimed on Japanese Patent Application No. 2010-220164, filed Sep. 30, 2010, the content of which is incorporated herein by reference.

BACKGROUND ART

In recent years, as part of response to the environment, removal of lead from semiconductor products has proceeded. In addition, since lead-free solder is used in installation on substrates, the solder reflow temperature is higher than in the case of conventional tin-lead solder. Therefore, as die-attach materials which adhere a semiconductor element such as an IC to a support such as a metal frame or an organic substrate, die-attach materials which can sufficiently withstand an increase in stress in a semiconductor package accompanying an increase in solder reflow temperature and on which peeling between members (for example, semiconductor element/sealing material, semiconductor element/die-attach layer, die-attach layer/solder resist (substrate surface), interior part of substrate (solder resist/copper trace), lead frame/die-attach layer, lead frame/sealing material, and the like) does not easily occur, that is, a die-attach material having a low-stress property and a high adhesion property at high temperature are particularly desirable.

Furthermore, recently, while a reduction in size and weight, a reduction in thickness, and an increase in functionality have proceeded remarkably in electronics such as cell phones, it is strongly required to reduce the sizes and thicknesses of semiconductor packages themselves, and with this, it is necessary to reduce the thickness of a semiconductor element in the semiconductor packages. As die-attach materials which adhere a semiconductor element to a support, a liquid die-attach material is often used due to reasons such as merits in terms of cost. However, when a liquid die-attach material is used in mounting of a semiconductor element which has been made thinner on a support, the liquid die-attach material easily creeps to an upper part of the semiconductor element, and thus it is desirable for the liquid die-attach material to exhibit favorable wet spreadability even under lower pressure in addition to the low-stress property and the high adhesion property at high temperature.

In order to meet requirements for the low-stress property and the high adhesion property at high temperature, a method in which a high-molecular-weight component having a low glass transition temperature (Tg) is added (for example, see Patent Document 1) has been considered. However, in this method, in order to obtain a liquid die-attach material, a large amount of diluent or solvent is used in order to dissolve the high-molecular-weight component and there is a problem in that the obtained die-attach material easily becomes stringy and thus has low coating applicability. When the die-attach material has a film shape, the influence on workability is removed. However, the film-shaped die-attach material is very poor in terms of embeddability into irregularities derived from the presence or absence of wirings on a surface of a support such as an organic substrate with a semiconductor element adhered thereto, and thus has a problem in that voids are easily caused.

In order to solve the problems, a method using a compound having a molecular weight of 1000 to 20000 has been considered and a liquid resin composition having excellent coating applicability and solder cracking resistance has been invented (for example, see Patent Document 2). However, when the compound having a molecular weight of 1000 to 20000 is added in such an amount as to exhibit favorable solder cracking resistance, the viscosity of the liquid resin composition increases and this causes a deterioration in wet spreadability under low pressure at the time of mounting a semiconductor element for which there has been highly demanded in recent years. As described above, there have been no liquid die-attach materials which can simultaneously satisfy the solder cracking resistance and the wet spreadability under low pressure at the time of mounting a semiconductor element.

CITATION LIST

Patent Document

[Patent Document 1] Japanese Unexamined Patent Application, First Publication No. 2005-154687

[Patent Document 2] Japanese Unexamined Patent Application, First Publication No. 2008-235501

SUMMARY OF INVENTION

Technical Problem

An object of the invention is to provide a liquid resin composition which exhibits a low elastic modulus and a favorable adhesion property at high temperature, and has excellent wet spreadability after mounting of a chip, and a semiconductor device which has excellent reliability such as solder cracking resistance when using such a liquid resin composition as a die-attach material for a semiconductor or an adhesive for a heat radiation member.

Solution to Problem

The object is solved by the invention according to the following [1] to [6].

[1] A liquid resin composition which adheres a semiconductor element or a heat radiation member and contains a (meth)acrylic copolymer having at least a radical polymerizable functional group to a support, in which the (meth)acrylic copolymer having a radical polymerizable functional group contains alkyl(meth)acrylate as a constituent monomer having a linear or branched alkyl group having 6 to 9 carbon atoms in an amount of 10 wt% to 40 wt% of entire constituent monomers.

[2] The liquid resin composition according to [1], in which the radical polymerizable functional group of the (meth)acrylic copolymer is at least one selected from the group consisting of a (meth)acryloyl group, a (meth)allyl group, a vinyl group, and a maleimide group.

[3] The liquid resin composition according to [1] or [2], in which a functional group equivalent weight of the radical polymerizable functional group of the (meth)acrylic copolymer is 1500 to 2500.

[4] The liquid resin composition according to any one of [1] to [3], in which the alkyl(meth)acrylate having a linear or branched alkyl group having 6 to 9 carbon atoms which is a constituent monomer of the (meth)acrylic copolymer is n-hexyl(meth)acrylate, n-heptyl(meth)acrylate, n-octyl(meth)acrylate, n-nonyl(meth)acrylate, 2-methyloctyl(meth)acrylate, 2-ethylheptyl(meth)acrylate, 2-ethylhexyl(meth)acrylate, isooctyl(meth)acrylate, or isononyl(meth)acrylate.

[5] The liquid resin composition according to any one of [1] to [4], in which the thermosetting adhesive composition contains at least one or more low-stress agents.

[6] A semiconductor device which is produced using the liquid resin composition according to any one of [1] to [5] as a die-attach material or a material for adhesion of a heat radiation member.

Advantageous Effects of Invention

A liquid resin composition of the invention has excellent coating applicability and wet spreadability under low pressure at the time of mounting a semiconductor element, and exhibits a low elastic modulus and a high adhesion property at high temperature. Therefore, when the liquid resin composition of the invention is used as a die-attach material or an adhesive for a heat radiation member, a semiconductor device having high reliability can be provided.

DESCRIPTION OF EMBODIMENTS

The invention relates to a liquid resin composition containing a (meth)acrylic copolymer having at least a radical polymerizable functional group, and the (meth)acrylic copolymer having a radical polymerizable functional group contains alkyl(meth)acrylate as a constituent monomer having a linear or branched alkyl group having 6 to 9 carbon atoms in an amount of 10 wt % to 40 wt % of the entire constituent monomers. Accordingly, excellent coating applicability and excellent wet spreadability under low pressure at the time of mounting a semiconductor element are obtained, and a low elastic modulus and a high adhesion property are exhibited at high temperature. Therefore, when the invention is used as a die-attach material or an adhesive for a heat radiation member, a semiconductor device having high reliability can be provided.

Hereinafter, the invention will be described in detail.

The (meth)acrylic copolymer having a radical polymerizable functional group which is used in the invention contains alkyl(meth)acrylate as a constituent monomer having a linear or branched alkyl group having 6 to 9 carbon atoms in an amount of 10 wt % to 40 wt % of the entire constituent monomers. The purpose of using the (meth)acrylic copolymer is that a cured material having a low elastic modulus can be obtained, and by virtue of this effect, an excellent low-stress property at high temperature can be applied. Furthermore, the (meth)acrylic copolymer preferably has a radical polymerizable functional group. The reason for this is that when the (meth)acrylic copolymer has a radical polymerizable functional group having high reactivity, a liquid resin composition having excellent curability can be obtained, and thus a cured material exhibiting a high adhesion property at high temperature can be obtained. Here, examples of the radical polymerizable functional group include a (meth)acryloyl group, a (meth)allyl group, a vinyl group, and a maleimide group, and among them, at least one is preferably used. Regarding the number of the radical polymerizable functional groups of the (meth)acrylic copolymer, the functional group equivalent weight is preferably 1500 to 2500. The reason for this is that when the functional group equivalent weight is less than the above range, the crosslink density increases and thus the low-stress property becomes poor, and when the functional group equivalent weight is greater than the above range, the curability deteriorates and this causes a reduction in adhesion property at high temperature. In addition, the molecular weight is preferably 1000 to 20000. The reason for this is that when the molecular weight is less than the above range, the intended low elastic modulus effect is not sufficiently exhibited, and when the molecular weight is greater than the above range, the viscosity of the liquid resin composition excessively increases and this causes a deterioration in coating applicability.

The (meth)acrylic copolymer preferably contains alkyl (meth)acrylate having a linear or branched alkyl group having 6 to 9 carbon atoms in an amount of 10 wt % to 40 wt % of the entire constituent monomers. Therefore, the (meth)acrylic copolymer has the linear or branched alkyl groups having 6 to 9 carbon atoms in its side chains, and by virtue of an influence of the steric hindrance of them, a (meth)acrylic copolymer having a low viscosity can be obtained. By virtue of this effect, even when the amount of the acrylic copolymer added is increased, the viscosity of the liquid resin composition can be kept low, and favorable wet spreadability can be realized even under low pressure at the time of mounting a semiconductor element. Here, the reason that the alkyl(meth)acrylate having a linear or branched alkyl group having 6 to 9 carbon atoms is restricted to being contained in an amount of 10 wt % to 40 wt % of the entire constituent monomers is that when the number of carbon atoms is less than the above range or the amount of the constituent monomer is less than the above range, no low-viscosity effect is expected, and when the number of carbon atoms is greater than the above range or the amount of the constituent monomer is greater than the above range, the reaction of the radical polymerizable functional group is inhibited and this causes a deterioration in curability.

Examples of the alkyl(meth)acrylate having a linear or branched alkyl group having 6 to 9 carbon atoms which is a constituent monomer of the (meth)acrylic copolymer include n-hexyl(meth)acrylate, n-heptyl(meth)acrylate, n-octyl (meth)acrylate, n-nonyl(meth)acrylate, 2-methyloctyl(meth)acrylate, 2-ethylheptyl(meth)acrylate, 2-ethylhexyl(meth)acrylate, isooctyl(meth)acrylate, isononyl(meth)acrylate, and the like. These can be used alone or as a mixture of two or more kinds.

The method of producing the (meth)acrylic copolymer which is used in the invention is not particularly limited. However, the (meth)acrylic copolymer can be produced using a known technique using a general radical polymerization initiator such as emulsion polymerization. At this time, at least three or more kinds of monomers are preferably used in producing the (meth)acrylic copolymer, and the three or more kinds of monomers are preferably an alkyl(meth)acrylate monomer having a linear or branched alkyl group having 6 to 9 carbon atoms, a (meth)acrylate monomer having a reactive functional group, and an alkyl(meth)acrylate monomer having a linear or branched alkyl group having 5 or less carbon atoms. The reason for using the (meth)acrylate monomer having a reactive functional group is that the radical polymerizable functional group is introduced. For example, when using a monomer having a carboxylic group such as a (meth) acrylic acid, a (meth)acrylic copolymer having a carboxylic group can be obtained. By reacting this copolymer with a compound having a radical polymerizable functional group and a hydroxyl group such as hydroxyethyl(meth)acrylate, hydroxyethyl vinyl ether, and (meth)allyl alcohol, a (meth) acrylic copolymer having a radical polymerizable functional group can be obtained. Otherwise, when using (meth)acrylate having a glycidyl group such as glycidyl(meth)acrylate, a (meth)acrylic copolymer having a glycidyl group can be obtained. By reacting this copolymer with a compound having a radical polymerizable functional group such as a (meth) acrylic acid, a maleimide amino acid, and derivatives thereof, the radical polymerizable functional group can be introduced to the (meth)acrylic copolymer.

Examples of the materials which are used as the alkyl (meth)acrylate monomer having a linear or branched alkyl group having 5 or less carbon atoms include methyl(meth)acrylate, ethyl(meth)acrylate, propyl(meth)acrylate, isopropyl(meth)acrylate, n-butyl(meth)acrylate, isobutyl(meth)acrylate, tert-butyl(meth)acrylate, and the like. These can be used alone or as a mixture of two or more kinds.

A filling material can also be contained in the liquid resin composition of the invention. The filling material is not particularly limited. However, examples thereof include metal powders such as a silver powder, a gold powder, a copper powder, an aluminum powder, a nickel powder, and a palladium powder, ceramic powders such as an alumina powder, a titania powder, an aluminum nitride powder, a boron nitride powder, and a silica powder, polymeric powders such as a polyethylene powder, a polyacrylate powder, a polytetrafluoroethylene powder, a polyamide powder, a polyurethane powder, and a polysiloxane powder. These can be used alone or as a mixture of two or more kinds. Among them, a powder having a hydrophobic functional group on a surface thereof, or a powder covered with a hydrophobic dispersant is preferable. The reason for this is that since wettability with the (meth)acrylic copolymer which has a hydrophobic property improved by containing the alkyl(meth)acrylate having a linear or branched alkyl group having 6 to 9 carbon atoms as a constituent monomer is improved using the powder, an increase in viscosity of the liquid resin composition can be more effectively suppressed and thus favorable wet spreadability is exhibited at the time of mounting a semiconductor element. Particularly, a silver powder is preferably used when a conductive property and thermal conductivity are required. As silver powders which are commercially available for general electronic materials, a reduced powder, an atomized powder, and the like are available. However, in the case of using silver powders other than the silver powders for electronic materials, caution should be exercised in using them since there are many cases in which ionic impurities are contained in a large amount.

The average particle size of the filling material is preferably 1 μm to 30 μm. The reason for this is that when the average particle size is smaller than the above range, the viscosity of the liquid resin composition excessively increases, and thus favorable workability cannot be obtained, and when the average particle size is greater than the above range, this causes nozzle clogging when the liquid resin composition is ejected using a nozzle.

Examples of the shape of the filling material include a flake shape, a spherical shape, and the like, and the shape is not particularly limited. For example, in the case of the silver powder, a powder having a flake shape is preferably used from the viewpoint of an improvement in preservability and workability. The amount of the filling material blended can be appropriately adjusted in accordance with the purpose, and for example, when the silver powder is used, generally, the amount thereof is 65 wt % or greater, and preferably 95 wt % or greater in the liquid resin composition. The reason for this is that when the amount of the silver powder blended is less than the above range, the conductive property deteriorates, and thus in many cases, the viscosity of the liquid resin composition excessively increases and this causes a deterioration in workability.

In addition, a low-stress agent can also be contained in the liquid resin composition of the invention. By using the low-stress agent, toughness and a low-stress property can be applied to a cured material of the liquid resin composition, and thus the adhesion property between a semiconductor element and a support is significantly improved and peeling occurs even more rarely. The low-stress agent which is used is not particularly limited. However, examples thereof include polyisoprene, polybutadiene, 1,2-polybutadiene, styrene-butadiene rubber, acrylonitrile-butadiene rubber, polychloroprene, poly(oxypropylene), poly(oxytetramethylene)glycol, polyolefin glycol, poly-ε-caprolactone, silicone rubber, polysulfide rubber, fluororubber, and the like. These can be used alone or as a mixture of two or more kinds thereof.

The amount of the low-stress agent blended is preferably 1 wt % to 15 wt % in the liquid resin composition. The reason for this is that when the blended amount is less than the above range, intended toughness and low-stress property cannot be sufficiently applied, and when the blended amount is greater than the above range, the viscosity of the liquid resin composition excessively increases and this causes a deterioration in workability.

In addition, regarding the low-stress agent, a low-stress agent having a functional group is more preferably used for the purpose of increasing compatibility with other resins. Specific examples of the functional group of the low-stress agent include a vinyl group, an epoxy group, a carboxy group, a hydroxyl group, and a maleic anhydride group, and the like. Among these functional groups, a low-stress agent having a maleic anhydride group is more preferably used from the viewpoint that the compatibility is increased and a liquid resin composition having excellent coating applicability is obtained.

The following compounds can also be contained in the liquid resin composition of the invention as necessary, from the viewpoint of curability, workability, adhesion property, reliability, and the like. Examples thereof include, but are not limited to 2-(meth)acryloyloxyethyl succinate, 2-(meth)acryloyloxypropyl succinate, 2-(meth)acryloyloxyethyl hexahydrophthalate, 2-(meth)acryloyloxypropyl hexahydrophthalate, 2-(meth)acryloyloxyethylmethyl hexahydrophthalate, 2-(meth)acryloyloxypropylmethyl hexahydrophthalate, 2-(meth)acryloyloxyethyl phthalate, 2-(meth)acryloyloxypropyl phthalate, 2-(meth)acryloyloxyethyl tetrahydrophthalate, 2-(meth)acryloyloxypropyl tetrahydrophthalate, 2-(meth)acryloyloxyethylmethyl tetrahydrophthalate, 2-(meth)acryloyloxypropylmethyl tetrahydrophthalate, 2-hydroxy 1,3di(meth)acryloxypropane, tetramethylolmethane tri(meth)acrylate, 2-hydroxyethyl(meth)acrylate, 2-hydroxypropyl(meth)acrylate, 2-hydrobutyl(meth)acrylate, glycerol di(meth)acrylate, 2-hydroxy-3-(meth)acryloyloxypropyl(meth)acrylate, 1,4-cyclohexanedimethanol mono(meth)acrylate, ethyl-α-(hydromethyl)(meth)acrylate, 4-hydroxybutyl(meth)acrylate, methyl(meth)acrylate, ethyl (meth)acrylate, n-butyl(meth)acrylate, isobutyl(meth)acrylate, tert-butyl(meth)acrylate, isodecyl(meth)acrylate, lauryl (meth)acrylate, tridecyl(meth)acrylate, cetyl(meth)acrylate, stearyl(meth)acrylate, isoamyl(meth)acrylate, isostearyl (meth)acrylate, behenyl(meth)acrylate, 2-ethylhexyl(meth) acrylate, other alkyl(meth)acrylates, cyclohexyl(meth)acrylate, tert-butylcyclohexyl(meth)acrylate, tetrahydrofurfuryl (meth)acrylate, benzyl(meth)acrylate, phenoxyethyl(meth) acrylate, isobornyl(meth)acrylate, glycidyl(meth)acrylate, trimethylolpropane tri(meth)acrylate, zinc mono(meth)acrylate, zinc di(meth)acrylate, dimethylaminoethyl(meth)acrylate, diethylaminoethyl(meth)acrylate, neopentylglycol (meth)acrylate, trifluoroethyl(meth)acrylate, 2,2,3,3-tetrafluoropropyl(meth)acrylate, 2,2,3,3,4,4-hexafluorobutyl (meth)acrylate, perfluorooctyl(meth)acrylate, perfluorooctylethyl(meth)acrylate, ethyleneglycol di(meth) acrylate, propyleneglycol di(meth)acrylate, 1,4-butanediol di(meth)acrylate, 1,6-hexanediol di(meth)acrylate, 1,9-nonanediol di(meth)acrylate, 1,3-butanediol di(meth)acrylate, 1,10-decanediol di(meth)acrylate, tetramethyleneglycol di(meth)acrylate, methoxyethyl(meth)acrylate, butoxyethyl (meth)acrylate, ethoxydiethyleneglycol(meth)acrylate, methoxypolyalkyleneglycol mono(meth)acrylate, octoxypolyalkyleneglycol mono(meth)acrylate, lauroxypolyalkyleneglycol mono(meth)acrylate, stearoxypolyalkyleneglycol mono(meth)acrylate, allyloxypolyalkyleneglycol mono (meth)acrylate, nonylphenoxypolyalkyleneglycol mono (meth)acrylate, N,N'-methylene bis(meth)acrylic amide, N,N'-ethylene bis(meth)acrylic amide, 1,2-di(meth)acrylic amide ethyleneglycol, di(meth)acryloyloxymethyltricyclodecane, 2-(meth)acryloyloxyethyl, N-(meth)acryloyloxyethylmaleimide, N-(meth)acryloyloxyethylhexahydrophthalimide, N-(meth)acryloyloxyethylphthalimide, N-vinyl-2-pyrrolidone, ethoxylated bisphenol A (meth)acrylate, propoxylated bisphenol A (meth)acrylate, a styrene derivative, a α-methylstyrene derivative, and the like.

Furthermore, a polymerization initiator can also be contained in the liquid resin composition of the invention. As the polymerization initiator, a thermoradical polymerization initiator is particularly preferably used. The polymerization initiator is not particularly limited as long as it is used as a general thermoradical polymerization initiator. However, polymerization initiators having a decomposition temperature of 40° C. to 140° C. in a rapid heating test (decomposition initiation temperature when 1 g of a sample is put on a hot plate and the temperature is increased at 4° C./min) are preferable. Since the preservability of the liquid resin composition at room temperature deteriorates, it is not preferable that the decomposition temperature be lower than 40° C., and since the curing time increases extremely, it is not preferable that the decomposition temperature be higher than 140° C. Specific examples of the thermoradical polymerization initiator satisfying the above conditions include methyl ethyl ketone peroxide, methylcyclohexanone peroxide, methyl acetoacetate peroxide, acetylacetone peroxide, 1,1-bis(t-butylperoxy)3,3,5-trimethylcyclohexane, 1,1-bis(t-hexylperoxy)cyclohexane, 1,1-bis(t-hexylperoxy)3,3,5-trimethylcyclohexane, 1,1-bis(t-butylperoxy)cyclohexane, 2,2-bis(4,4-di-t-butylperoxycyclohexyl)propane, 1,1-bis(t-butylperoxy) cyclododecane, n-butyl4,4-bis(t-butylperoxy)valerate, 2,2-bis(t-butylperoxy)butane, 1,1-bis(t-butylperoxy)-2-methylcyclohexane, t-butyl hydroperoxide, p-menthane hydroperoxide, 1,1,3,3-tetramethylbutyl hydroperoxide, t-hexyl hydroperoxide, dicumyl peroxide, 2,5-dimethyl-2,5-bis(t-butylperoxy)hexane, α,α'-bis(t-butylperoxy)diisopropylbenzene, t-butylcumyl peroxide, di-t-butyl peroxide, 2,5-dimethyl-2,5-bis(t-butylperoxy)hexyne, 3-isobutyryl peroxide, 3,5,5-trimethylhexanoyl peroxide, octanoyl peroxide, lauroyl peroxide, cinnamoyl peroxide, m-toluoyl peroxide, benzoyl peroxide, diisopropyl peroxydicarbonate, bis(4-t-butylcyclohexyl)peroxydicarbonate, di-3-methoxybutyl peroxydicarbonate, di-2-ethylhexyl peroxydicarbonate, di-sec-butyl peroxydicarbonate, di(3-methyl-3-methoxybutyl)peroxydicarbonate, di(4-t-butylcyclohexyl)peroxydicarbonate, α,α'-bis(neodecanoylperoxy)diisopropylbenzene, cumyl peroxyneodecanoate, 1,1,3,3-tetramethylbutyl peroxyneodecanoate, 1-cyclohexyl-1-methylethyl peroxyneodecanoate, t-hexyl peroxyneodecanoate, t-butyl peroxyneodecanoate, t-hexyl peroxypivalate, t-butyl peroxypivalate, 2,5-dimethyl-2,5-bis(2-ethylhexanoylperoxy)hexane, 1,1,3,3-tetramethylbutyl peroxy-2-ethylhexanoate, 1-cyclohexyl-1-methylethyl peroxy-2-ethylhexanoate, t-hexyl peroxy-2-ethylhexanoate, t-butyl peroxy-2-ethylhexanoate, t-butyl peroxyisobutyrate, t-butyl peroxymaleic acid, t-butyl peroxylaurate, t-butyl peroxy-3,5,5-trimethylhexanoate, t-butylperoxyisopropyl monocarbonate, t-butyl peroxy-2-ethylhexyl monocarbonate, 2,5-dimethyl-2,5-bis(benzoylperoxy)hexane, t-butyl peroxyacetate, t-hexyl peroxybenzoate, t-butyl peroxy-m-toluoylbenzoate, t-butyl peroxybenzoate, bis(t-butylperoxy)isophthalate, t-butyl peroxyallyl monocarbonate, 3,3',4,4'-tetra(t-butylperoxycarbonyl)benzophenone, and the like. These initiators can be used alone or as a mixture of two or more kinds for controlling the curability. The amount of the polymerization initiator blended is preferably 0.02 wt % to 5 wt %, and more preferably 0.05 wt % to 2 wt % in the liquid resin composition.

Here, the liquid resin composition of the invention is generally used under illumination such as fluorescent light. Accordingly, when a photopolymerization initiator is contained, an increase in viscosity is observed due to the reaction during use. Therefore, it is not preferable that the photopolymerization initiator is substantially contained. Substantially, the photopolymerization initiator may be present in such a small amount that an increase in viscosity is not observed, or the photopolymerization initiator is preferably not contained.

Furthermore, the liquid resin composition of the invention can also use additives such as a coupling agent, a defoaming agent, and a surfactant. The liquid resin composition of the invention can be manufactured by, for example, premixing the components, kneading the mixture using three rolls, and then performing defoaming under vacuum.

Known methods can be used as a method of producing a semiconductor device using the liquid resin composition of the invention. For example, using a commercially available die bonder, the liquid resin composition is dispensed and applied to a predetermined part in a lead frame or a substrate, and then a semiconductor element is mounted and the liquid resin composition is cured by heating. Thereafter, wire bonding is performed and transfer molding is thus performed using an epoxy resin, thereby producing a semiconductor device. Otherwise, after flip chip junction, the liquid resin composition is dispensed to a rear chip surface of a flip chip ball grid array (BGA) or the like sealed with an under-filling material, and a heat radiation component such as a heat spreader or a lid is mounted and the liquid resin composition is cured by heating.

EXAMPLES

Hereinafter, the invention will be described in detail on the basis of Examples and Comparative Examples, but the invention is not limited thereto.

Production of Acrylic Copolymer 1

An acrylic copolymer having a glycidyl group was obtained through general emulsion polymerization using glycidyl acrylate as a (meth)acrylate monomer having a reactive functional group, ethyl acrylate as an alkyl(meth)acrylate monomer having a linear or branched alkyl group having 5 or less carbon atoms, and 2-ethylhexyl acrylate as an alkyl (meth)acrylate monomer having a linear or branched alkyl group having 6 to 9 carbon atoms, and then by reacting the glycidyl group of the copolymer with an acrylic acid, an acryloyl group-containing acrylic copolymer 1 (molecular weight: 20000, functional group equivalent weight: 2000, the amount of 2-ethylhexyl acrylate (having 8 carbon atoms) blended was 25 wt % in the entire constituent monomers) was obtained. The molecular weight was adjusted using a chain-transfer agent, and the functional group equivalent weight was adjusted in accordance with the blending ratio of the monomers.

Production of Acrylic Copolymer 2

An acryloyl group-containing acrylic copolymer 2 (molecular weight: 13000, functional group equivalent weight:

2000, the amount of 2-ethylhexyl acrylate (having 8 carbon atoms) blended was 25 wt % in the entire constituent monomers) having a different molecular weight was obtained in the same manner as in the method of producing the acrylic copolymer 1 using glycidyl acrylate, ethyl acrylate, and 2-ethylhexyl acrylate as constituent monomers. The molecular weight was adjusted using a chain-transfer agent, and the functional group equivalent weight was adjusted in accordance with the blending ratio of the monomers.

Production of Acrylic Copolymer 3

An acryloyl group-containing acrylic copolymer 3 (molecular weight: 7000, functional group equivalent weight: 2000, the amount of 2-ethylhexyl acrylate (having 8 carbon atoms) blended was 25 wt % in the entire constituent monomers) having a different molecular weight was obtained in the same manner as in the method of producing the acrylic copolymer 1 using glycidyl acrylate, ethyl acrylate, and 2-ethylhexyl acrylate as constituent monomers. The molecular weight was adjusted using a chain-transfer agent, and the functional group equivalent weight was adjusted in accordance with the blending ratio of the monomers.

Production of Acrylic Copolymer 4

An acryloyl group-containing acrylic copolymer 4 (molecular weight: 13000, functional group equivalent weight: 2000, the amount of n-hexyl acrylate (having 6 carbon atoms) blended was 25 wt % in the entire constituent monomers) having different constituent monomers was obtained in the same manner as in the method of producing the acrylic copolymer 2 using glycidyl acrylate, ethyl acrylate, and n-hexyl acrylate as constituent monomers. The molecular weight was adjusted using a chain-transfer agent, and the functional group equivalent weight was adjusted in accordance with the blending ratio of the monomers.

Production of Acrylic Copolymer 5

An acryloyl group-containing acrylic copolymer 5 (molecular weight: 13000, functional group equivalent weight: 1500, the amount of 2-ethylhexyl acrylate (having 8 carbon atoms) blended was 25 wt % in the entire constituent monomers) having a different functional group equivalent weight was obtained in the same manner as in the method of producing the acrylic copolymer 2 using glycidyl acrylate, ethyl acrylate, and 2-ethylhexyl acrylate as constituent monomers. The molecular weight was adjusted using a chain-transfer agent, and the functional group equivalent weight was adjusted in accordance with the blending ratio of the monomers.

Production of Acrylic Copolymer 6

An acryloyl group-containing acrylic copolymer 6 (molecular weight: 13000, functional group equivalent weight: 2500, the amount of 2-ethylhexyl acrylate (having 8 carbon atoms) blended was 25 wt % in the entire constituent monomers) having a different functional group equivalent weight was obtained in the same manner as in the method of producing the acrylic copolymer 2 using glycidyl acrylate, ethyl acrylate, and 2-ethylhexyl acrylate as constituent monomers. The molecular weight was adjusted using a chain-transfer agent, and the functional group equivalent weight was adjusted in accordance with the blending ratio of the monomers.

Production of Acrylic Copolymer 7

An acryloyl group-containing acrylic copolymer 7 (molecular weight: 20000, functional group equivalent weight: 2000, alkyl(meth)acrylate as a constituent monomer was ethyl acrylate (having 2 carbon atoms) and alkyl(meth)acrylate having a linear or branched alkyl group having 6 to 9 carbon atoms was not contained) having different constituent monomers was obtained in the same manner as in the method of producing the acrylic copolymer 1 using glycidyl acrylate and ethyl acrylate as constituent monomers. The molecular weight was adjusted using a chain-transfer agent, and the functional group equivalent weight was adjusted in accordance with the blending ratio of the monomers.

Production of Acrylic Copolymer 8

An acryloyl group-containing acrylic copolymer 8 (molecular weight: 7000, functional group equivalent weight: 2000, alkyl(meth)acrylate as a constituent monomer was ethyl acrylate (having 2 carbon atoms) and alkyl(meth)acrylate having a linear or branched alkyl group having 6 to 9 carbon atoms was not contained) having a different molecular weight was obtained in the same manner as in the method of producing the acrylic copolymer 7 using glycidyl acrylate and ethyl acrylate as constituent monomers. The molecular weight was adjusted using a chain-transfer agent, and the functional group equivalent weight was adjusted in accordance with the blending ratio of the monomers.

Production of Acrylic Copolymer 9

An acryloyl group-containing acrylic copolymer 9 (molecular weight: 13000, functional group equivalent weight: 2000, the amount of lauryl acrylate (having 12 carbon atoms) blended was 25 wt % in the entire constituent monomers) having different constituent monomers was obtained in the same manner as in the method of producing the acrylic copolymer 2 using glycidyl acrylate, ethyl acrylate, and lauryl acrylate as constituent monomers. The molecular weight was adjusted using a chain-transfer agent, and the functional group equivalent weight was adjusted in accordance with the blending ratio of the monomers.

Production of Acrylic Copolymer 10

An acryloyl group-containing acrylic copolymer 10 (molecular weight: 13000, functional group equivalent weight: 2000, the amount of 2-ethylhexyl acrylate (having 8 carbon atoms) blended was 5 wt % in the entire constituent monomers) in which constituent monomers are blended at a different blending ratio was obtained in the same manner as in the method of producing the acrylic copolymer 2 using glycidyl acrylate, ethyl acrylate, and 2-ethylhexyl acrylate as constituent monomers. The molecular weight was adjusted using a chain-transfer agent, and the functional group equivalent weight was adjusted in accordance with the blending ratio of the monomers.

Production of Acrylic Copolymer 11

An acryloyl group-containing acrylic copolymer 11 (molecular weight: 13000, functional group equivalent weight: 2000, the amount of 2-ethylhexyl acrylate (having 8 carbon atoms) blended was 50 wt % in the entire constituent monomers) in which constituent monomers are blended at a different blending ratio was obtained in the same manner as in the method of producing the acrylic copolymer 2 using glycidyl acrylate, ethyl acrylate, and 2-ethylhexyl acrylate as constituent monomers. The molecular weight was adjusted using a chain-transfer agent, and the functional group equivalent weight was adjusted in accordance with the blending ratio of the monomers.

Example 1

The acrylic copolymer 1, maleic anhydride-modified polybutadiene (number average molecular weight: 3100, acid value: 74 meqKOH/g, manufactured by Satomer, Ricobond 1731, hereinafter, low-stress agent) obtained by reaction of maleic anhydride with polybutadiene in which the proportion of 1,4-vinyl bonds was 72%, propoxylated bisphenol A diacrylate (manufactured by Shin-Nakamura Chemical Co., Ltd., NK ESTER A-BPP-3, hereinafter, monomer 1), 1,6- hexanediol dimethacrylate (manufactured by Kyoeisha Chemical Co., Ltd., LIGHT ESTER 1,6HX, hereinafter, monomer 2), isobornyl methacrylate (manufactured by Kyoeisha Chemical Co., Ltd., LIGHT ESTER IBX, hereinafter, monomer 3), a silane coupling agent having a methacryl group (manufactured by Shin-Etsu Chemical Co., Ltd., KBM-503P, hereinafter, coupling agent 1), a silane coupling agent having a glycidyl group (manufactured by Shin-Etsu Chemical Co., Ltd., KBM-403E, hereinafter, coupling agent 2), 1,1-di(tert-butylperoxy)cyclohexane (manufactured by Nippon Oil and Fats Co., Ltd., Perhexa CS, hereinafter, polymerization initiator), and a flaky silver powder (hereinafter, silver powder) having an average particle size of 8 μm and a maximum particle size of 30 μm were blended as shown in Table 1. The mixture was kneaded using three rolls, and then defoaming was performed to obtain a liquid resin composition. Then, evaluation was performed through the following evaluation methods. The results thereof are shown in Table 1. The blending ratios are based on parts by weight.

Examples 2 to 6

The components were blended in proportions shown in Table 1 and liquid resin compositions were obtained in the same manner as in Example 1, respectively. Then, evaluation was performed.

The acrylic copolymer 2 was used in Example 2, the acrylic copolymer 3 was used in Example 3, the acrylic copolymer 4 was used in Example 4, the acrylic copolymer 5 was used in Example 5, and the acrylic copolymer 6 was used in Example 6.

Comparative Examples 1 to 5

The components were blended in proportions shown in Table 1 and liquid resin compositions were obtained in the same manner as in Example 1, respectively. Then, evaluation was performed.

The acrylic copolymer 7 was used in Comparative Example 1, the acrylic copolymer 8 was used in Comparative Example 2, the acrylic copolymer 9 was used in Comparative Example 3, the acrylic copolymer 10 was used in Comparative Example 4, and the acrylic copolymer 11 was used in Example 5.

Evaluation Methods

Viscosity: The value was measured at 2.5 rpm at 25° C. immediately after production of the liquid resin composition using an E-type viscometer (3° cone). The viscosity values of 20±10 Pa·S were determined to be acceptable. The unit of the viscosity is Pa·S.

Wet Spreadability: Using the liquid resin composition shown in Table 1, a silicon chip (7 mm×7 mm, thickness: 0.2 mm) was mounted on a BT substrate (substrate using a BT resin formed of a cyanate monomer, its oligomer and bismaleimide) having a thickness of 0.3 mm under low pressure such that about 70% of the chip got wet. Thereafter, the BT substrate was left at room temperature for 10 minutes, and then a non-wetted degree of the chip was measured using an X-ray visualization device. Cases in which the non-wetted area with the liquid resin composition in the chip was less than 5% were determined to be acceptable. The unit of the non-wetted area is %.

Reflow Resistance: Using the liquid resin composition shown in Table 1, a silicon chip (7 mm×7 mm, thickness: 0.2 mm) was mounted on a BT substrate (substrate using a BT resin formed of a cyanate monomer, its oligomer and bismaleimide) having a thickness of 0.3 mm under low pressure such that about 70% of the chip got wet. Thereafter, the BT substrate was left at room temperature for 10 minutes, and then the silicon chip and the BT substrate were adhered to each other by curing the liquid resin composition at 175° C. for 15 minutes (lamp up 30 minutes). The die-bonded substrate was sealed in a panel shape of 5.5 mm×6.6 mm×1.0 mm using an epoxy resin composition for semiconductor sealing (manufactured by Sumitomo Bakelite Co., Ltd., EME-G760), and then post-mold curing was performed for 4 hours at 175° C., followed by IR reflow carried out once in a state in which the moisture was not absorbed. Thereafter, a semiconductor device (MAPBGA) was obtained by division using a dicing saw having a body size of 10 mm×12 mm. The obtained semiconductor device was subjected to a hygroscopic treatment for 72 hours at a relative humidity of 85% at 85° C., and then subjected to an IR reflow treatment (260° C., 10 seconds, 3-time reflow). The peeling degree of the semiconductor device after the treatments was measured using an ultrasonic-flaw detector (transmission type). Cases in which the peeling area of a die-attach portion was less than 10% were determined to be acceptable. The unit of the peeling area is %.

TABLE 1

| | Examples | | | | | | Comparative Examples | | | | |
|---|---|---|---|---|---|---|---|---|---|---|---|
| | 1 | 2 | 3 | 4 | 5 | 6 | 1 | 2 | 3 | 4 | 5 |
| Silver Powder | 75.00 | 75.00 | 75.00 | 75.00 | 75.00 | 75.00 | 75.00 | 75.00 | 75.00 | 75.00 | 75.00 |
| Acrylic Copolymer 1 | 3.35 | | | | | | | | | | |
| Acrylic Copolymer 2 | | 4.46 | | | | | | | | | |
| Acrylic Copolymer 3 | | | 5.58 | | | | | | | | |
| Acrylic Copolymer 4 | | | | 4.46 | | | | | | | |
| Acrylic Copolymer 5 | | | | | 4.46 | | | | | | |
| Acrylic Copolymer 6 | | | | | | 4.46 | | | | | |
| Acrylic Copolymer 7 | | | | | | | 3.35 | | | | |
| Acrylic Copolymer 8 | | | | | | | | 5.58 | | | |
| Acrylic Copolymer 9 | | | | | | | | | 4.46 | | |
| Acrylic Copolymer 10 | | | | | | | | | | 4.46 | |
| Acrylic Copolymer 11 | | | | | | | | | | | 4.46 |
| Low-Stress Agent | 2.23 | 2.23 | 2.23 | 2.23 | 2.23 | 2.23 | 2.23 | 2.23 | 2.23 | 2.23 | 2.23 |
| Monomer 1 | 11.16 | 11.16 | 11.16 | 11.16 | 11.16 | 11.16 | 11.16 | 11.16 | 11.16 | 11.16 | 11.16 |
| Monomer 2 | 1.12 | 1.12 | 1.12 | 1.12 | 1.12 | 1.12 | 1.12 | 1.12 | 1.12 | 1.12 | 1.12 |
| Monomer 3 | 6.70 | 5.58 | 4.46 | 5.58 | 5.58 | 5.58 | 6.70 | 4.46 | 5.58 | 5.58 | 5.58 |
| Coupling Agent 1 | 0.11 | 0.11 | 0.11 | 0.11 | 0.11 | 0.11 | 0.11 | 0.11 | 0.11 | 0.11 | 0.11 |
| Coupling Agent 2 | 0.11 | 0.11 | 0.11 | 0.11 | 0.11 | 0.11 | 0.11 | 0.11 | 0.11 | 0.11 | 0.11 |
| Polymerization Initiator | 0.22 | 0.22 | 0.22 | 0.22 | 0.22 | 0.22 | 0.22 | 0.22 | 0.22 | 0.22 | 0.22 |
| Viscosity      Pa·s | 20 | 17 | 18 | 19 | 17 | 17 | 28 | 23 | 15 | 21 | 14 |

TABLE 1-continued

|  |  | Examples | | | | | | Comparative Examples | | | | |
| --- | --- | --- | --- | --- | --- | --- | --- | --- | --- | --- | --- | --- |
|  |  | 1 | 2 | 3 | 4 | 5 | 6 | 1 | 2 | 3 | 4 | 5 |
| Wet Spreadability (wet area) | % | <5 | <5 | <5 | <5 | <5 | <5 | >20 | >20 | <5 | 10 | <5 |
| Reflow Resistance (peeling area) | % | <10 | <10 | <10 | <10 | <10 | <10 | >30 | >30 | >30 | 15 | 15 |
| Comprehensive Evaluation |  | ○ | ○ | ○ | ○ | ○ | ○ | x | x | x | x | x |

INDUSTRIAL APPLICABILITY

Since a liquid resin composition of the invention has favorable wet spreadability, it can be applied to chips having a small thickness. Accordingly, a semiconductor device having excellent solder cracking resistance can be obtained even in a high-temperature environment due to an IR reflow process or the like.

The invention claimed is:

1. A liquid resin composition which adheres a semiconductor element or a heat radiation member and contains a (meth) acrylic copolymer having at least a radical polymerizable functional group to a support,
wherein the (meth)acrylic copolymer having a radical polymerizable functional group contains alkyl(meth) acrylate as a constituent monomer having a linear or branched alkyl group having 6 to 9 carbon atoms in an amount of from 10 wt % to 40 wt % of entire constituent monomers, and wherein a functional group equivalent weight of the radical polymerizable functional group of the (meth)acrylic copolymer is from 1500 to 2500.

2. The liquid resin composition according to claim 1, wherein the radical polymerizable functional group of the (meth)acrylic copolymer is at least one selected from the group consisting of a (meth)acryloyl group, a (meth) allyl group, a vinyl group, and a maleimide group.

3. The liquid resin composition according to claim 1, wherein the alkyl(meth)acrylate which is a constituent monomer of the (meth)acrylic copolymer is n-hexyl (meth)acrylate, n-heptyl(meth)acrylate, n-octyl(meth) acrylate, n-nonyl(meth)acrylate, 2-methyloctyl(meth) acrylate, 2-ethylheptyl(meth)acrylate, 2-ethylhexyl (meth)acrylate, isooctyl(meth)acrylate, or isononyl (meth)acrylate.

4. The liquid resin composition according to claim 1, wherein the thermosetting adhesive composition contains at least one or more low-stress agents.

5. A semiconductor device which is produced using the liquid resin composition according to claim 1 as a die-attach material or a material for adhesion of a heat radiation member.

* * * * *